United States Patent [19]

Kandpal et al.

[11] Patent Number: 4,768,079
[45] Date of Patent: Aug. 30, 1988

[54] FIELD EFFECT TRANSISTOR DEVICE

[75] Inventors: Pramode Kandpal, Billerica, Mass.; Jean C. Collinet, Scottsdale, Ariz.; Bernhard A. Ziegner, Westford; James A. Bowen, Andover, both of Mass.

[73] Assignee: M/A Com, Inc., Burlington, Mass.

[21] Appl. No.: 107,954

[22] Filed: Oct. 13, 1987

Related U.S. Application Data

[63] Continuation of Ser. No. 638,637, Aug. 7, 1984, abandoned.

[51] Int. Cl.$^4$ .................... H01L 23/50; H01L 29/76; H03B 9/14
[52] U.S. Cl. ......................... 357/74; 357/81; 357/51; 357/57; 331/117 FE; 331/107 DP
[58] Field of Search ............... 357/51, 74, 81, 57; 331/107 DP, 117 FE

[56] References Cited

U.S. PATENT DOCUMENTS 3,767,946 10/1973 Berger et al. .................. 330/277
4,566,027 1/1986 Heitzmann et al. ............ 357/81
4,611,882 9/1986 Ushida .......................... 357/74

FOREIGN PATENT DOCUMENTS 56-73906 6/1981 Japan .................. 331/117 FE

OTHER PUBLICATIONS

Schellenberg et al., 1981, IEEE MTT-S International Microwave Symposium, Los Angeles, 15-19 Jun. 1981, pp. 328-330.
Tsironis et al., Electronics Letter, Apr. 15, 1982, vol. 18, No. 8, pp. 345-347.

Primary Examiner—Andrew J. James
Assistant Examiner—John Lamont
Attorney, Agent, or Firm—Wolf, Greenfield & Sacks

[57] ABSTRACT

A two-terminal field effect transistor device which is capable of operation as an oscillator including a field effect transistor connected in a two-terminal manner. The transistor has the usual drain source and gate electrodes and oscillating instability is provided by means of an inductance means of value so as to provide this circuit instability to enable circuit oscillations. The two-terminal arrangement is enabled by means of essentially interconnecting the gate and drain electrodes by way of said inductance means.

13 Claims, 14 Drawing Sheets

M/A 4F001 GaAs FET EQUIVALENT CIRCUIT

THEORETICAL OUTPUT REFLECTION COEFFICIENT $S_{22}$
OF COMMON SOURCE

EQUIVALENT CIRCUIT OF TWO TERMINAL FET

THEORETICAL INPUT REFLECTION COEFFICIENT $S^1_{22}$ OF TWO TERMINAL FET

THEORETICAL REAL AND IMAGINARY PART OF INPUT IMPEDANCE
AS A FUNCTION OF FREQUENCY- SMALL SIGNAL MODEL

EQUIVALENT CIRCUIT OF TWO TERMINAL FET CHIP AT F = 11.5 GHz

MEASURED INPUT REFLECTION COEFFICIENT OF A PACKAGED TWO TERMINAL FET USING A NETWORK ANALYZER

MEASURED REAL AND IMAGINARY PART OF INPUT IMPEDANCE AS A FUNCTION OF FREQUENCY AT $V_{OP}$= 8.0V

FET CHIP IN ODS-30 PACKAGE  $V_{OP}$=8.0V
f =11.5GHz

TRANSFORMED FET CHIP BY ODS-30 PACKAGE

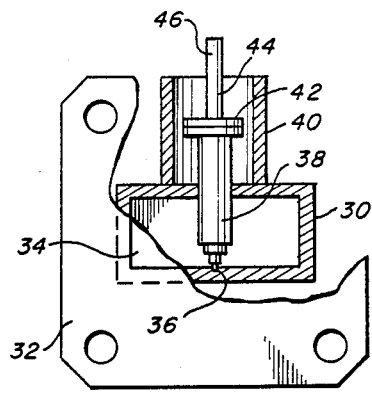
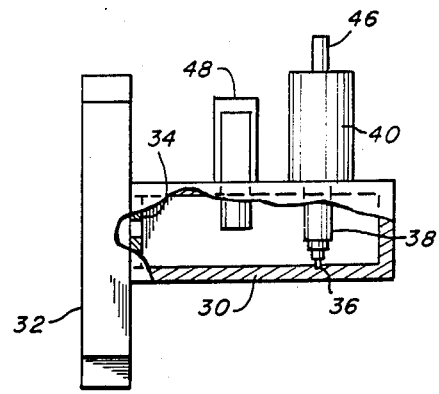
Fig. 9A                Fig. 9B
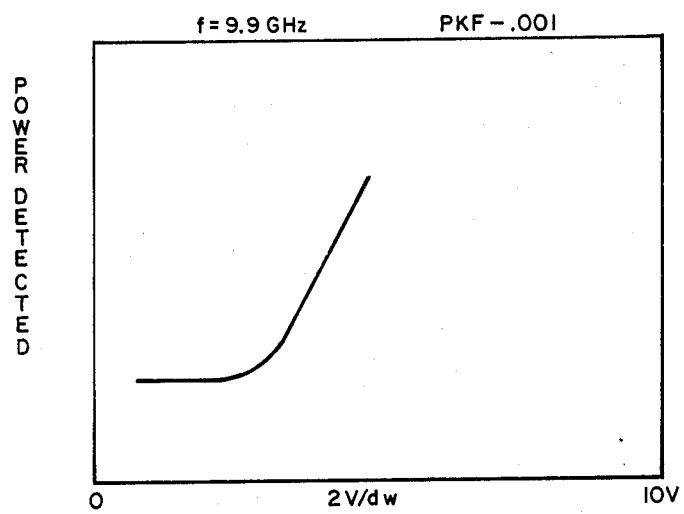
POWER SWEPT RESPONSE OF A TWO TERMINAL
FET OSCILLATOR
Fig. 10

ELECTRONIC TUNING OF TWO TERMINAL FET OSCILLATOR

FET WITH DIODE

DC I-V CHARACTERISTICS OF FET

TWO TERMINAL FET-MONOLITHIC CIRCUIT

FET

FIELD EFFECT TRANSISTOR DEVICE

This application is a continuation of application Ser. No. 638,637, filed Aug. 7, 1984, now abandoned.

BACKGROUND OF THE INVENTION

The present invention relates in general to a field effect transistor device operated as a field effect transistor oscillator. More particularly, the invention pertains to a two-terminal field effect transistor device. Even more particularly, the present invention relates to a two-terminal field effect transistor device that is adapted to readily replace a Gunn diode type device, or may be further adapted to replace other types of microwave oscillators such as Impatt, Baritt, Tunnel, Bipolar transistor, and 3-terminal FET oscillators.

Gunn diode devices and more particularly Gunn diode oscillators are now extensively used in many commercial applications. For example, such devices are used in microwave transmitters and local oscillators in communication systems and also in Dopler radar systems and in intrusion alarm systems. These devices may also find use in traffic control sensors and in industrial control systems.

For two-terminal devices, such as Gunn, Impatt, or Tunnel diode devices, the application of an appropriate DC voltage level is generally sufficient to produce negative resistance at the device terminals. This negative resistance condition exists up to microwave frequencies and all that has to be done is to provide a proper load for RF coupling.

With regard to the Gunn diode device, commercial microwave sources employ a packaged Gunn diode which may be mounted, for example, in a rectangular waveguide cavity. Up to the present, field effect transistors have not been used in the same package configuration basically because they are three terminal devices. The three terminal field effect transistor device, such as a GaAs FET, by itself will not produce any negative resistance by the application of a DC voltage and thus does not sustain oscillations. The field effect transistor requires a biasing network in order to operate as an oscillator and thus they are not capable of being packaged in the same manner as a Gunn diode and thus have not been used as a commercial microwave source in a package such as of MACOM type ODS-30.

It is also noted that although Gunn diode devices are relatively in-expensive, they have certain drawbacks associated therewith. For example, Gunn diode oscillators have relatively low efficiency and usually require a relatively high "turn-on" voltage.

Accordingly, it is an object of the present invention to provide a field effect transistor device constructed as a two-terminal device and operable as a field effect transistor oscillator.

Another object of the present invention is to provide a two-terminal FET device in accordance with the preceding object and which is adapted for packaging in substantially the same manner as the packaging for a Gunn diode device. In accordance with the invention, the field effect transistor oscillator of this invention is incorporated in a two-terminal package, an example of which is package type ODS-30.

A further object of the present invention is to provide a two-terminal FET oscillator device characterized by wideband mechanical and electronic tuning along with improved frequency stability with temperature.

Still another object of the present invention is to provide a two-terminal FET oscillator device that has a low operating bias voltage and operates with a higher efficiency.

Another object of the present invention is to provide a two-terminal FET oscillator device that is easy to handle, has acceptable noise level for most commercial applications, is very easily replaced, and can be manufactured at low cost.

Still another object of the present invention is to provide a two-terminal FET oscillator device that may be either in the form of an integrated circuit chip mounted in a standard package or may be embodied so that the oscillator circuit is integrated into a monolithic circuit, both of which are described in further detail hereinafter.

SUMMARY OF THE INVENTION

To accomplish the foregoing and other objects, features and advantages of the invention, there is provided a two-terminal field effect transistor oscillator circuit that comprises a field effect transistor having drain, source, and gate electrodes. The two-terminals that are referred to may be considered as first and second circuit terminals. Means are provided for conductively coupling the drain electrode to the first circuit terminal. Similarly, a conductive means is provided for coupling the gate electrode to the second circuit terminal. The source electrode is also coupled to the second circuit terminal so as to provide the desired two-terminal device. This latter means includes inductive means of relatively small but of sufficient value so as to provide circuit instability to enable circuit oscillations. In other words, the inclusion of the proper inductance means produces negative resistance operation while the inductive means at the same time enables proper DC biasing of the transistor and furthermore enables proper device grounding. In one embodiment in accordance with the invention, the inductive means comprises a length of wire. The coupling from the gate electrode also may include a length of wire that is substantially shorter in length than the source coupling inductance wire. The length of the inductance wire may be in the range of 70-100 mils (1.7 to 2.5 millimeters) which corresponds to X-band operation. The gate wire has negligible inductance at least an order of magnitude less than the inductance of the source inductance wire. The inductance means preferably has an inductance in the range of 0.4-1.0 nanoHenry.

In accordance with one embodiment of the present invention, the second circuit terminal is defined by a pedestal having the field effect transistor chip supported thereon with the gate and source electrodes thereof being coupled by separate wires bonded to the metal pedestal. This pedestal is disposed within a package means and the package means generally comprises an insulating member and top conductive flange to which the drain electrode is connected. In accordance with an alternate embodiment of the present invention, the field effect transistor oscillator circuit is provided as an integrated monolithic circuit. In still another embodiment in accordance with the invention, the inductance means may have associated therewith, a diode coupled in series with the inductive means. The diode is positioned so that the forward voltage drop thereof reverse biases the gate electrode of the transistor so as to in effect, move the circuit operating point to a more linear region of the current-voltage characteristics of the field effect transistor. The aforementioned diode may be replaced by a resistor-capacitor network in series with the inductive means. The resistor and capacitor may be coupled in parallel.

BRIEF DESCRIPTION OF THE DRAWINGS

Numerous other objects, features and advantages of the invention should now become apparent upon a reading of the following detailed description taken in conjunction with the accompanying drawing, in which:

FIGS 1A and 1B illustrate a first embodiment of the present invention incorporated into a Gunn diode type package while

FIGS. 9A and 9B illustrate an iris coupled waveguide cavity incorporating a device of this invention;

FIG. 10 is a plot of voltage power versus voltage swept response for the iris coupled waveguide cavity FET oscillator;

DETAILED DESCRIPTION

Figure 1A:
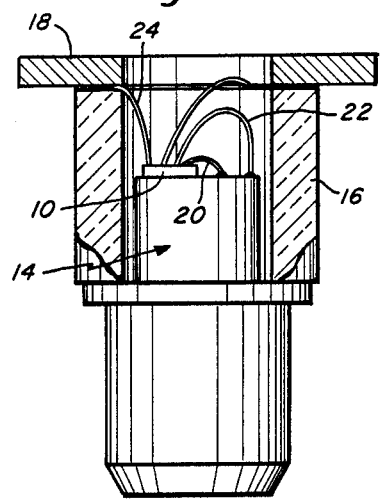
Figure 1B:
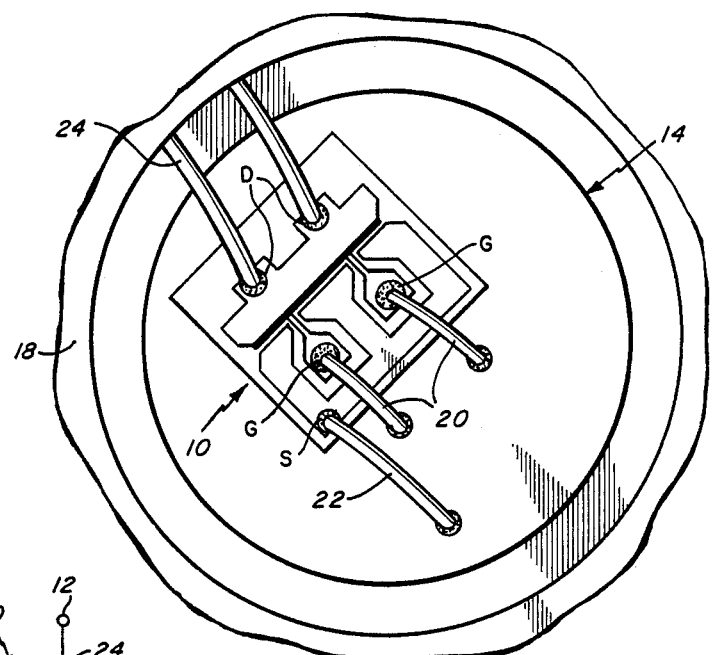
Figure 1C:
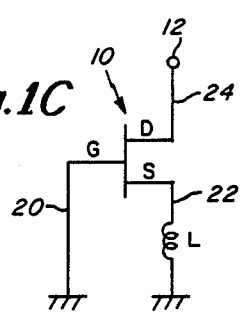
FIG. 1C illustrates a circuit diagram for the field effect transistor oscillator of the invention.

Reference is now made to the drawings, and in particular, to FIGS. 1A and 1B which illustrate a first embodiment of the present invention. FIG. 1C illustrates the circuit diagram for the field effect transistor oscillator mounted in a two-terminal package. FIG 1A shows a GaAs FET chip 10 with its associated gate, source and drain terminals. FIG. 1B is a plan view illustrating the FET chip 10 showing two gate terminals (pads) G, two drain terminals (pads) D, and a single source terminal S. FIG. 1B actually illustrates a two-terminal FET construction. FIG. 1C shows the circuit topography illustrating the transistor 10 with its terminals G, D, and S. FIG. 1C also shows a first circuit terminal 12 which is one of the terminals of the two-terminal device. The other terminal is represented by the ground symbol in FIG. 1C. In this connection, it is noted that the gate electrode G couples directly to ground while the source electrode S couples by way of inductance L to ground. Thus, from the circuit diagram of FIG. 1C, it can be seen that the gate and source are in a sense connected together so as to form the two-terminal device, but the source is coupled to ground by way of an inductance of appropriate value to be discussed in further detail hereinafter.

With further reference to FIG. 1A, it is noted that the FET chip 10 is supported on a gold-plated copper pedestal 14 which forms a second circuit terminal illustrated by the ground symbol in FIG. 1C. The packaging for the FET chip which is essentially of package type ODS-30, also includes a cylindrical insulating member 16 and a top conductive flange 18.

The gate and source electrodes are bonded to the pedestal 14, and in this connection, note in FIGS. 1A and 1B the wire 20 coupling from the gate electrode to the pedestal 14 at the top surface thereof. There is also illustrated a source wire 22 of substantially greater length than the wire 20 for coupling the source electrode S to the pedestal 14 at its top flat surface where the chip 10 is mounted. Both the gate and the source electrodes are bonded to the pedestal using a 7/10 mil gold, for example, wire. The length of the gate wire 20 is kept as short as possible, while the length of the source wire 22 is preferably in the range of 70–100 mils for X-band operation.

With regard to the connection of the drain electrode, there is provided a drain bond wire 24 which is connected to the top of the package. The package is then welded with a flange prong 18. The flange 18 defines the aforementioned first circuit terminal.

In connection with the mounting of the FET chip 10, this may be mounted in a similar manner to the way that a Gunn diode chip is mounted. The package illustrated in FIG. 1A is heated on a hot plate to a temperature of on the order of 280° C. A solder preform is placed on the pedestal 14 using a vacuum pickup and this preform is allowed to melt. The FET chip 10 is then carefully dropped onto the melted solder. This positions and retains the chip in the position illustrated in FIGS. 1A and 1B.

As indicated previously, a 7/10 mil gold wire is used for wires 20 and 22 as well as the wire 24. It has also indicated previously, that the length of the gate wire should be as small as possible. It is preferred to have an essentially negligible inductance of the gate wire. The gate wire should have an inductance on the order of only 0.01 nH.

As indicated previously, it is basically the source wire 22 that is made of a substantial enough length so as to create the desired inductance. This inductance provides feedback to produce negative resistance between the terminal 12 and ground, as referenced in FIG. 1C. In this way, there is provided essentially a two-terminal FET. With this device, it has been found that the device exhibits negative resistance over a relatively broad range of frequency. By changing the length (and so the reactance) of the source wire, the band coverage may be shifted up or down in frequency to some extent.

Reference may now be made to FIGS. 2–5 in connection with a theoretical model of the FET circuit of this invention. FIG. 2A shows the equivalent circuit of the GaAs FET. Using a Supercompact tm program, this circuit may be analyzed to determine its S parameters as a function of frequency. In this connection, FIG. 2B shows the output reflection coefficient $S_{22}$ of common source plotted on the Smith chart. It can be seen that the output reflection coefficient $S_{22}$ locus lies inside the unit circle as expected. This plot inside of the unit circle indicates a stable condition of the transistor. This presupposes that the equivalent circuit is for the transistor alone essentially without any substantial additional components being added thereto.

Figure 2A:
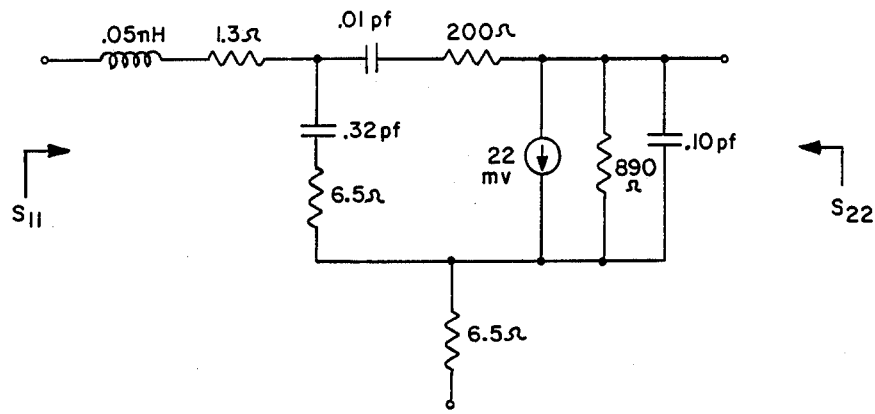
FIG. 2A shows the equivalent circuit of a GaAs FET.
Figure 2B:
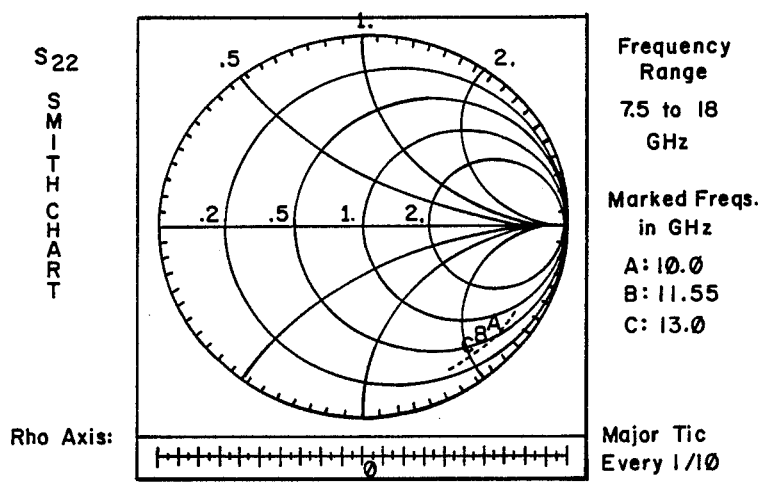
FIG. 2B shows the output reflection coefficient plotted on a Smith chart.
Figure 3A:
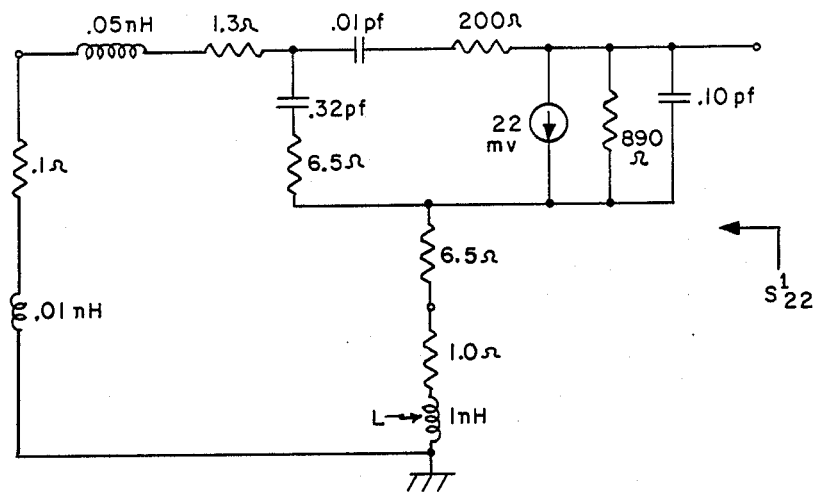
FIG. 3A illustrates another equivalent circuit with the gate electrode now shorted to ground and with the source electrode connected to ground by way of the inductance.

FIG. 3A shows essentially the same circuit as illustrated in FIG. 2A but with the gate now shorted to ground and with the source electrode connected to ground by way of the inductance L. The inductance L, as indicated previously, is represented by a gold wire which may be, for example, 100 mils long. The gate wire has very little resistance and inductance approximately on the order of 0.1 ohm and 0.01 nanoHenry, respectively, as set forth in FIG. 3A. The inductance at the source terminal is on the order of 1.0 nH corresponding to a length of wire of 100 mils (of an inch).

Figure 3B:
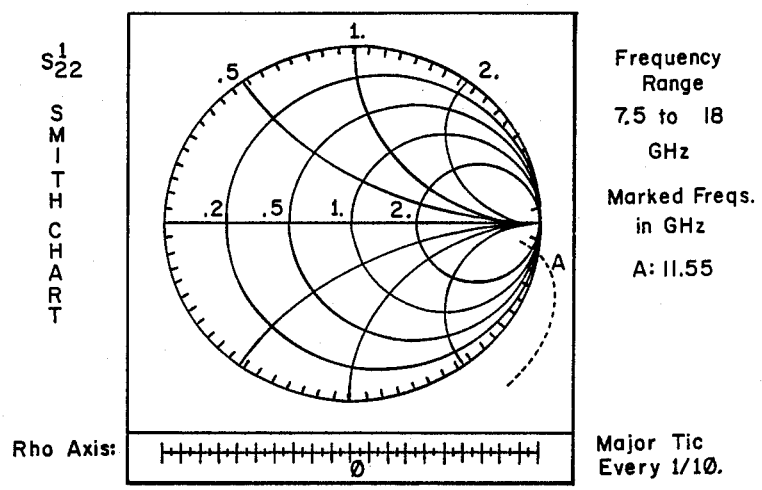
FIG. 3B is a Smith chart illustrating the input reflection coefficient plotted for the two terminal FET of this invention.
Figure 4:
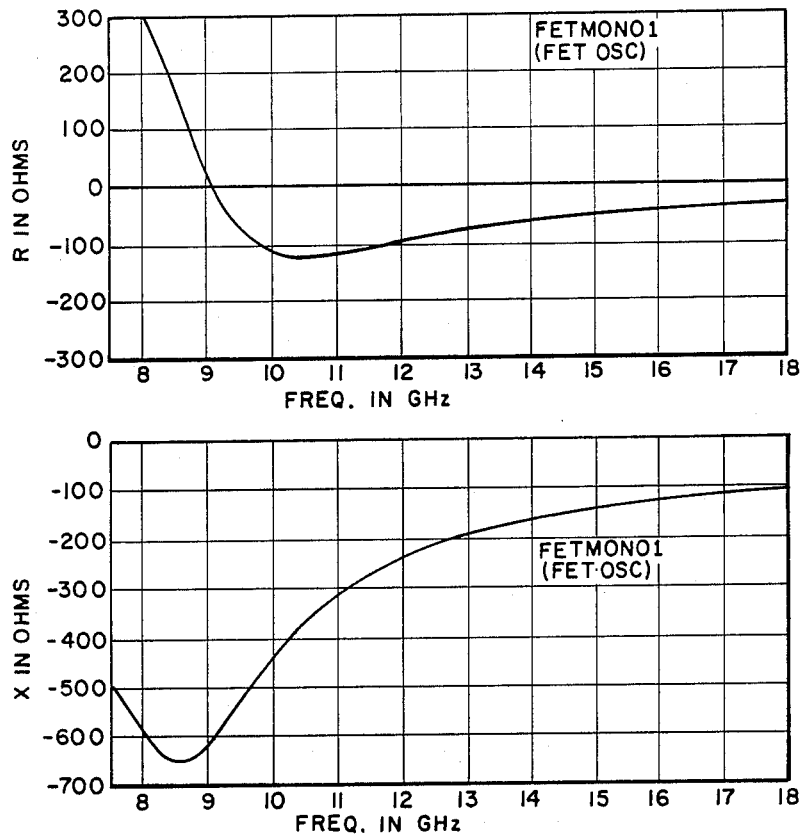
FIG. 4 illustrates resistance and reactance plotted for a frequency range of 7.5 GHz to 18.0 GHz.

FIG. 3B is a Smith chart illustrating the input reflection coefficient $S_{22}'$ plotted for the two-terminal FET. It can be seen that the input reflection coefficient $S_{22}'$ locus lies outside of the unit circle, thus indicating potential instability in the circuit. The locus outside the unit circle represents an oscillation region and that inside the circle represents a stable region.

Thus, it has been illustrated that it is possible to develop a negative resistance across the two FET terminals. One can now, using the super compact program, examine the impedance of the device by examining the real and imaginary parts of the input impedance as a function of frequency. In this connection, reference may be made to FIG. 4 which shows resistance and reactance plotted for a frequency range of 7.5 GHz to 18.0 GHz. As is apparent from FIG. 4, the device exhibits negative resistance from approximately 9.2 GHz to 18.0 GHz. The imaginary part of the device impedance is capacitive and in the negative resistance region, decreases with frequency.

Figure 5:
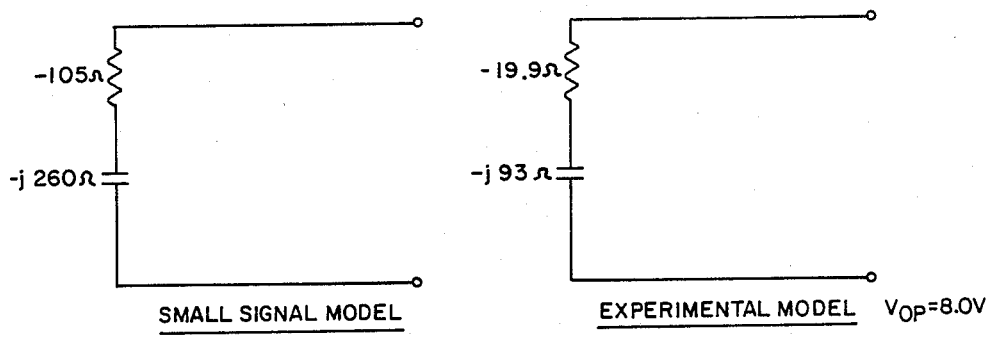
FIG. 5 shows the equivalent circuit of the two terminal FET.

From these results, the equivalent circuit of the two-terminal FET can be easily predicted. FIG. 5 shows the equivalent circuit at a frequency of 11.5 GHz.

Figure 6:
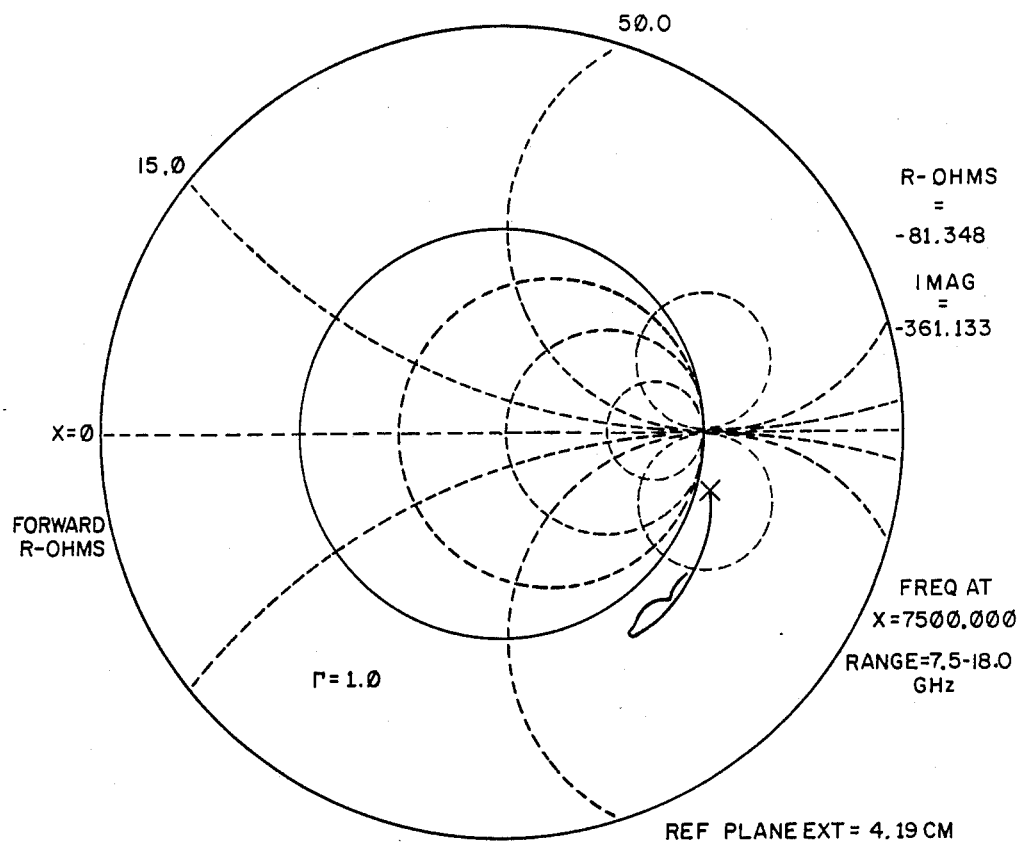
FIG. 6 is a plot of reflection coefficient as a function of frequency on a Smith chart for a two terminal FET of this invention.
Figure 7:
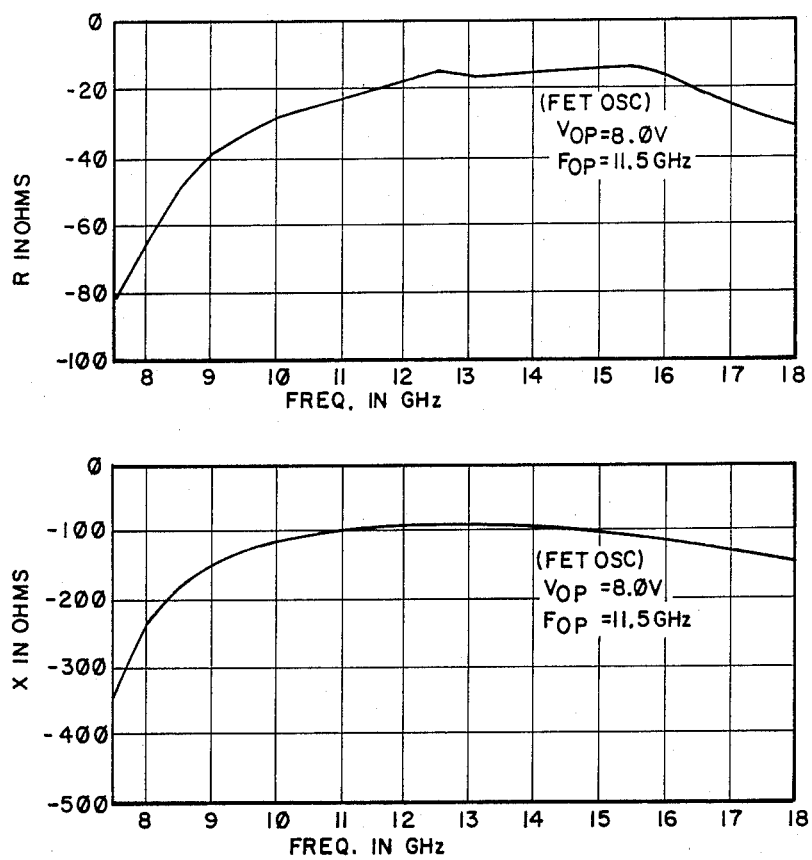
FIG. 7 illustrates a plot of resistance and reactance as a function of frequency.

The theoretical model that has just been discussed explains the basic nature of the FET device. However, it does not necessarily take into account the large signal conditions which exist in the actual operation of the device. In order to thus characterize the device, one may use a microwave network analyzer. The two-terminal FET may be mounted in a coaxial fixture and the measurements may be made using an automated network analyzer set-up. In this connection, FIG. 6 shows the plot of reflection coefficient as a function of frequency on a Smith chart for a two-terminal FET. Again, the locus that is illustrated is outside of the unit circle and thus represents a region of oscillation. From the above data, the device resistance and reactance is plotted as illustrated in FIG. 7. It is noted that the general nature of the impedance resembles the theoretical model.

Figure 8:
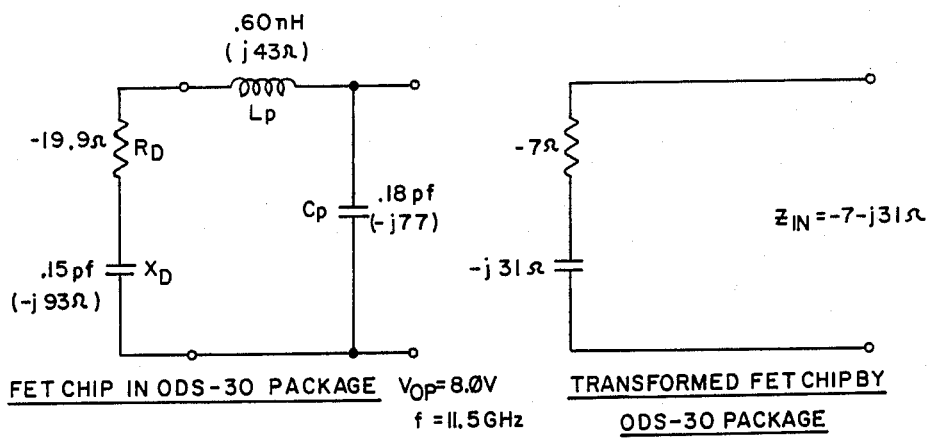
FIG. 8 shows the complete packaged equivalent circuit.

In the above analysis, consideration has not been given to the packaging of the two-terminal FET chip. The FET circuit is modified by the presence of the package parasitic reactances. The package can be described by two reactive elements, a series inductance Lp. The complete packaged equivalent circuit is shown in FIG. 8. Typical values for Lp and Cp for the ODS-30 package are 0.60 nH and 0.18 pF, respectively. The overall impedance of the packaged two-terminal FET circuit for this case is $Zin = -7 - j31$ ohms.

There are several properties of the two-terminal FET equivalent circuit that are noteworthy, as follows:

(1) In the frequency domain of 9.2 to 18 GHz, and for the type of FET chip used, the magnitude of the negative resistance $R_D$ is usually much smaller than that of the reactance $X_D$ and consequently the magnitude of the FET impedance is approximately that of the reactance $X_D$.

(2) The values of negative resistance are generally small compared to the usual transmission line impedances. Typical values are in the vicinity of several ohms.

(3) The package transforms the FET chip impedance to a lower value.

(4) The negative resistance of the FET varies with signal level. The decrease of resistance $R_D$ with signal level is what leads to stable oscillation.

(5) The impedance of the two-terminal, packaged FET is of the same magnitude as that of a low power Gunn diode. It should therefore be possible to treat the two-terminal FET device like a Gunn diode device as far as circuit design is concerned.

In order to obtain the desired power output and frequency, the external circuit is preferably designed so that $R_D(w) + R_L(w) = 0$ and $X_D(w) + X_L(w) = 0$ i.e.:

(1) The series reactance $X_L(w)$ presented to the terminals of the device should resonate with the reactance $X_D(w)$ seen looking into the device.

(2) The series resistance $R_L(w)$ presented to the terminals of the device should be equal to or less than the magnitude of the negative resistance $R_D(w)$ seen looking into the device at the desired frequency.

(3) The series resistance presented to the terminals of the device should be higher than the magnitude of the negative resistance seen looking into the device at all other possible resonant frequencies.

The easiest way to satisfy all these requirements is to use a cavity oscillator circuit. In this connection, reference may be made to FIGS. 9A and 9B which show an iris coupled waveguide cavity. This structure includes a waveguide cavity 30 having at one end a coupling flange 32 and having supported therein the iris plate 34. The two-terminal FET 36 is mounted from the coupling post 38. The drawing also shows the coupling post 38 extending into the waveguide from the top chamber 40. There is also illustrated associated with the chamber 40, an RF disk 42 and a choke 44 which couples to the bias terminal 46. The FET 36 is disposed approximately one-half guide wavelength away from the thin iris plate 34 that couples power into the load. The cavity operates in the $TE_{101}$ mode. Output coupling is set by the iris dimensions and frequency tuning is achieved by the insertion of a tuning screw 48. Typically, the tuning screw 48 is of a dielectric material and is inserted between the FET and the iris. In practice, the two-terminal FET has been directly substituted for a Gunn diode without requiring any major changes in cavity dimensions.

FIG. 10 shows the output power versus voltage swept response for the iris coupled waveguide cavity FET oscillator. It is noted from FIG. 10 that the oscillator turns on at a relatively low voltage, particularly in comparison with the higher "turn-on" voltage of a Gunn oscillator. Also, the power consumption is much less with the FET oscillator than with an equivalent Gunn oscillator with the same basic characteristics of output power and frequency. Because the FET has a very broad negative resistance frequency domain, it has also been noted that there is thus a very large mechanical tuning range that is available. This tuning range is on the order of 3–4 GHz at X-band.

Figure 11:
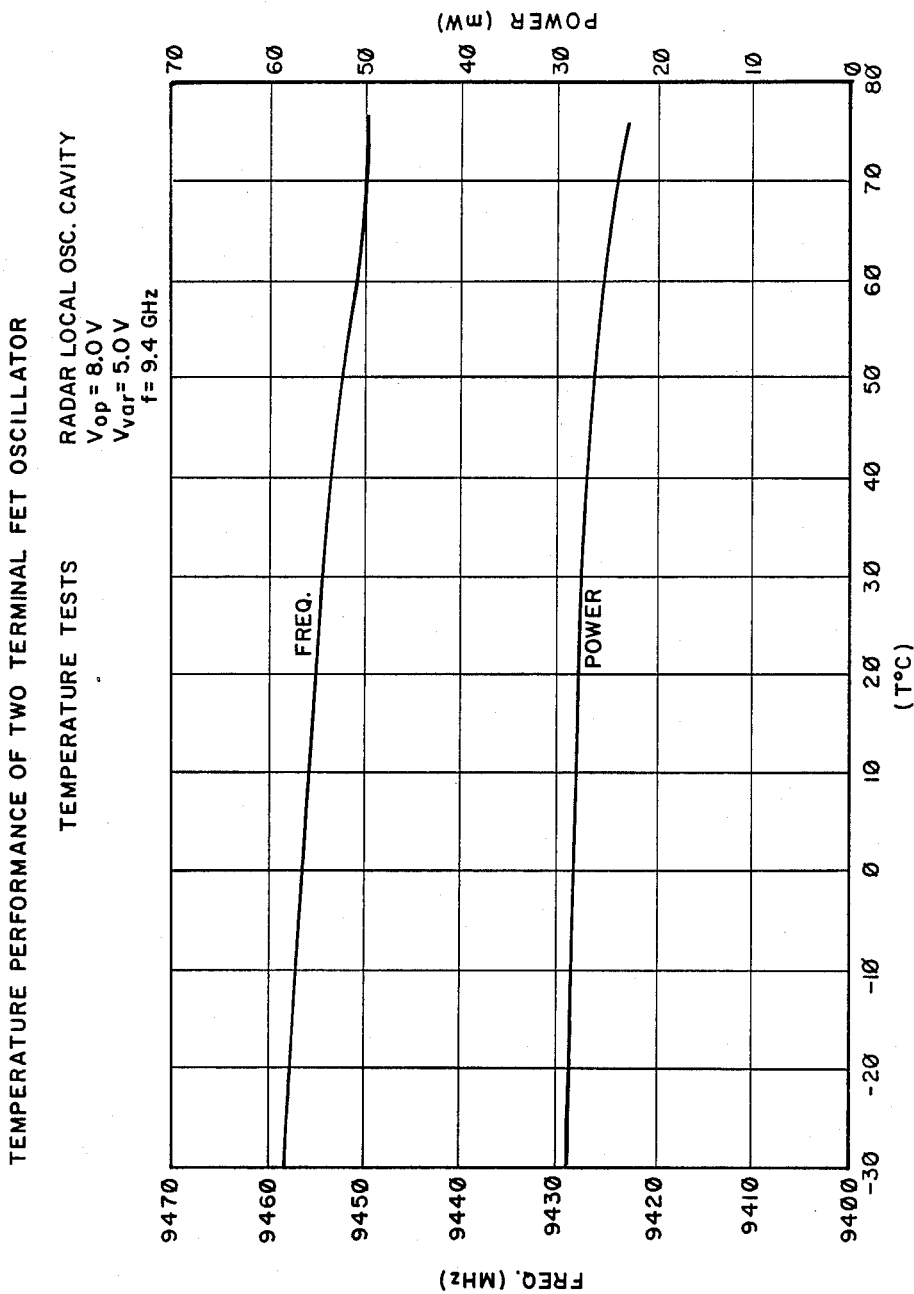
FIG. 11 is a plot showing the oscillation frequency and output power for a temperature range from $-30°$ C. to $+70°$ C.

The following are some important performance parameters:

A. Temperature performance: FIG. 11 shows the oscillation frequency and output power for a temperature range from $-30°$ C. to $+70°$ C. Frequency stability on the order of $-80$ KHz/°C. and power stability of 0.01 db/°C. is obtained. Frequency drift with temperature is caused by two phenomenons: (1) metal expansion of the cavity and (2) diode capacity change. Since an FET has lower junction capacitance than a Gunn diode, the overall contribution to the diode capacity change is smaller than for a Gunn diode. In connection with the testing of several FET's in different cavities, the frequency stability obtained was always better than that of a Gunn diode. Improved temperature performance may additionally be achieved by having copper clad invar for the cavity walls, using dielectric tuner assemblies having negative dielectric constant temperature coefficients.

Figure 12:
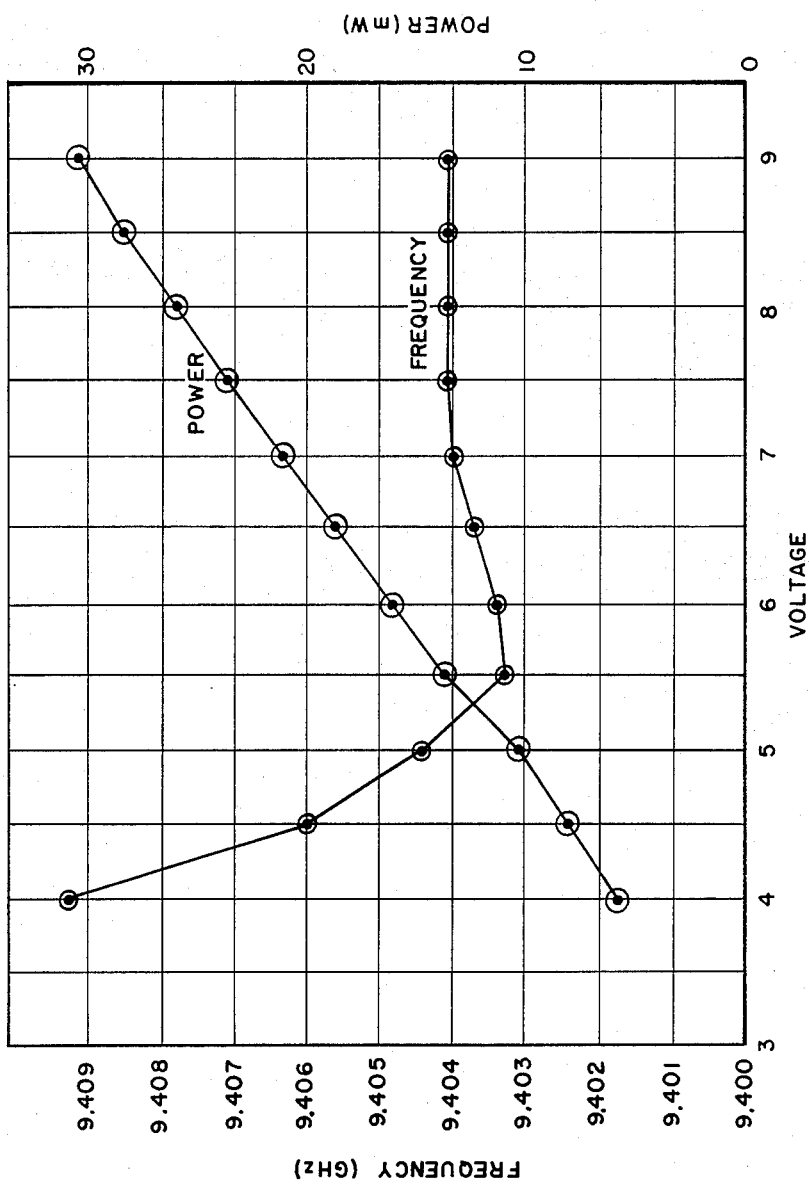
FIG. 12 is a plot of frequency and output power as a function of bias voltage.

B. Pushing performance: FIG. 12 shows the frequency and output power as a function of bias voltage. It can be seen that near the operating voltage, frequency pushing is essentially zero. This brings out the possibility of using the FET for pulse oscillators which need low pushing for low chirp (frequency drift during the pulse).

Figure 13:
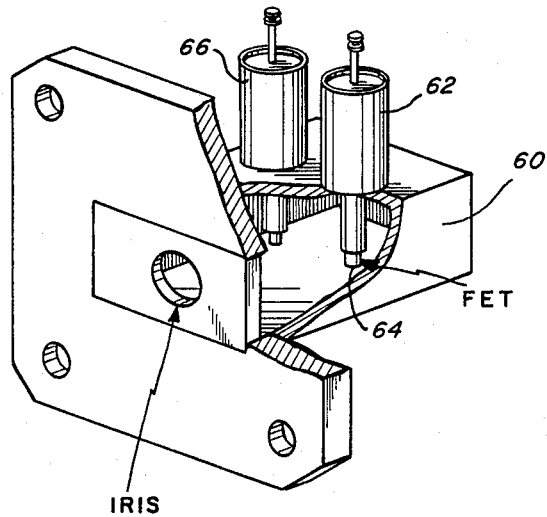
FIG. 13 shows the basic iris coupled waveguide cavity.
Figure 14:
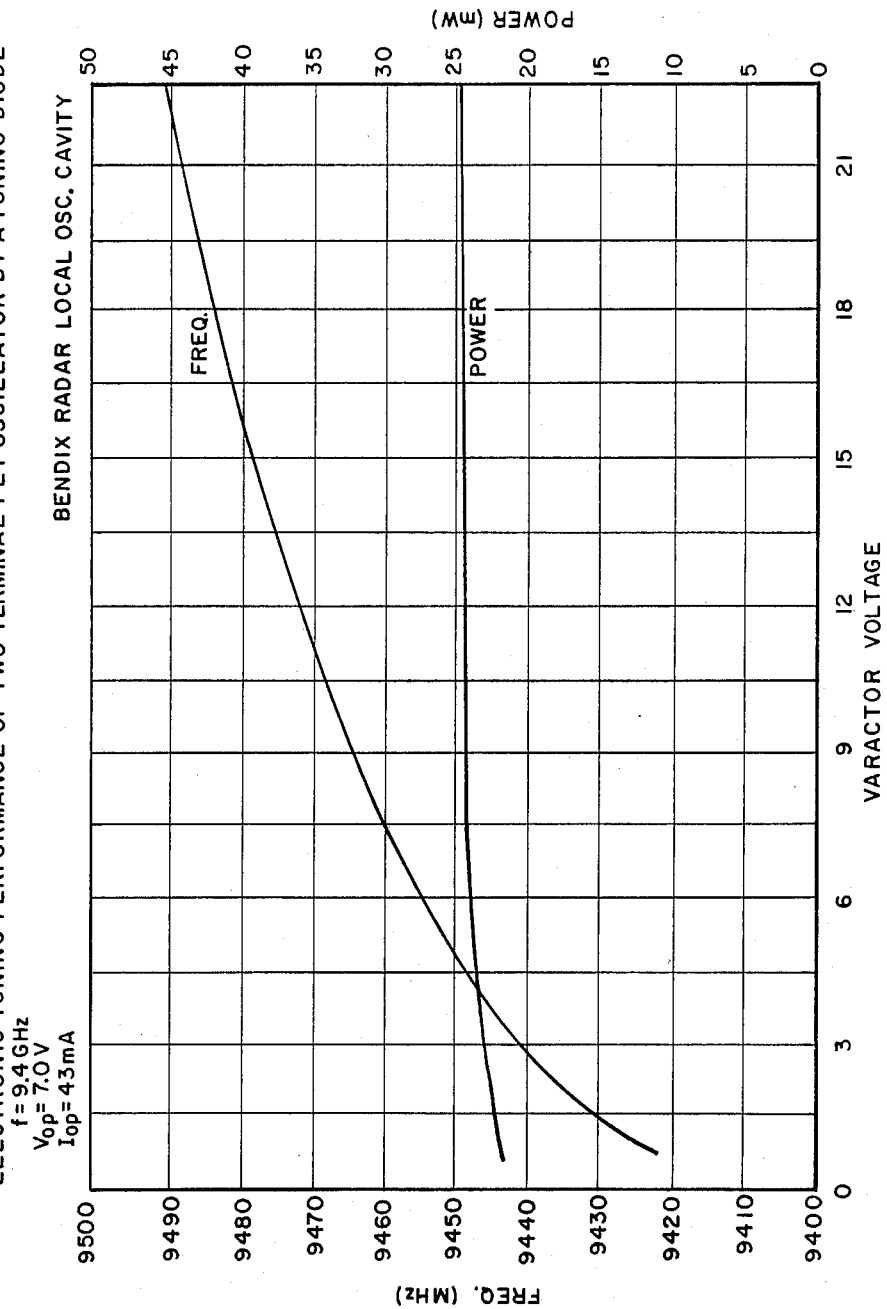
FIG. 14 illustrates the tuning characteristics for an X-band cavity.

C. Electronic tuning: Some electronic tuning is usually required of an oscillator for frequency modulation or AFC. The two-terminal FET described herein adapts itself to the simplicity of varactor tuned Gunn oscillators. Electronic tuning is achieved by placing a varactor diode in the cavity with the FET. FIG. 13 shows the basic iris coupled waveguide cavity 60 having a first post 62 in the form of an RF choke supplying the FET 64. There is also provided a second post for providing varactor bias for varactor tuning. The tuning characteristics are illustrated in FIG. 14 for an X-band cavity. An abrupt junction varactor diode with $C_{TO}=1.75$ pF was used for this experiment. An electronic tuning range of about 60 MHz was obtained which was the same when a FET was replaced with the Gunn diode. Power variation was less than 0.5 dB. Upon trying electronic tuning of two-terminal FET oscillators with different varactors and different cavities, the results were basically the same.

D. Noise performance: The noise performance of a GaAs FET oscillator in accordance with the invention is performance wise somewhere between that of a Gunn and Impatt oscillator. The loaded Q of the FET and the Gunn oscillator is about the same at 400. The spectrum of the FET oscillator is closely equivalent to that of the Gunn oscillator as noted.

Figure 15:
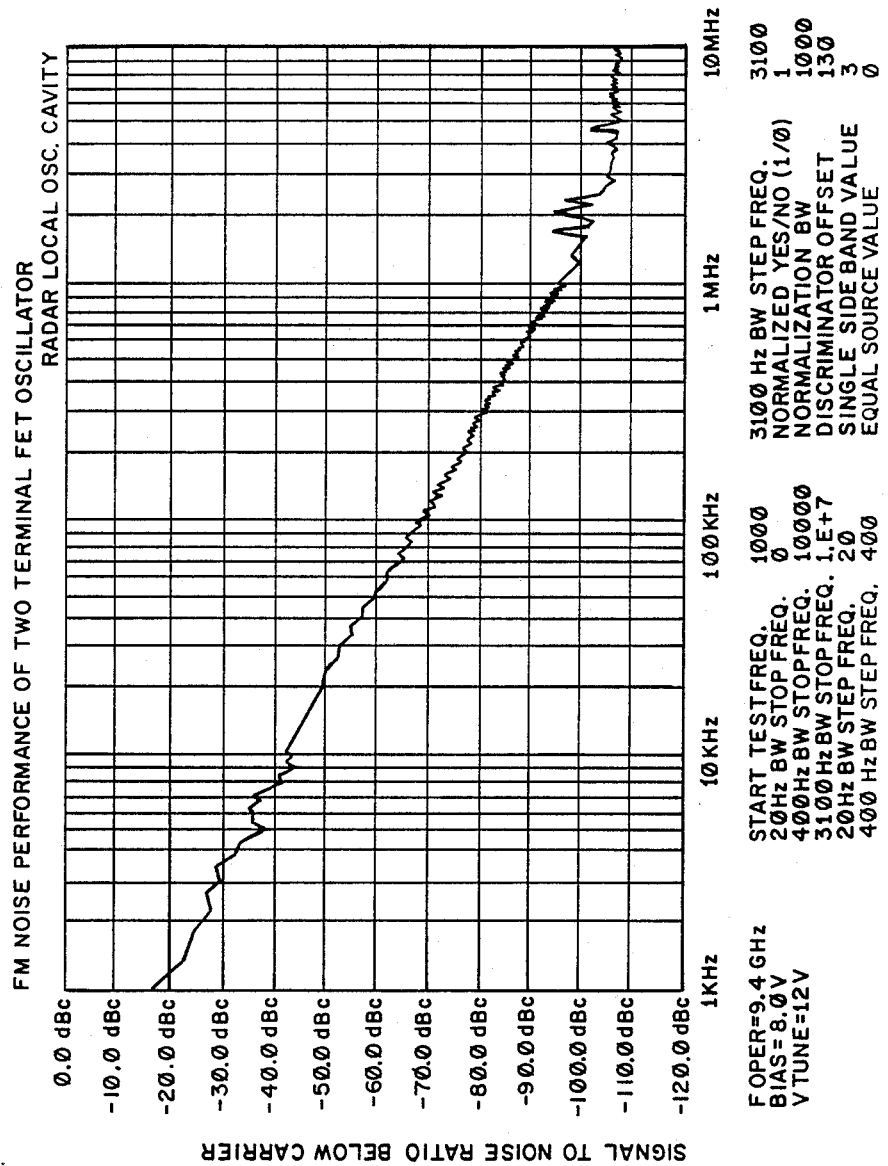
FIG. 15 shows typical performance obtained for the device in this invention.

The FM noise was measured for a varactor tuned oscillator in 1 KHz bandwidth as a function of off-carrier frequency. Typical performance obtained was $-100$ dBc/Hz at 100 KHz, as noted in FIG. 15. It was also observed that FM noise is nearly constant for small changes (plus or minus 1.5V) in bias voltage. This performance is sufficient for many commercial applications including communications and test equipment.

Reference may now be made to Table 1 which shows electrical characteristics and comparisons between a Gunn oscillator and the two-terminal FET oscillator of the present invention. Particularly of importance is the comparison of DC bias voltage and current which clearly indicates the low operating voltage characteristics of the FET oscillator. There is also improved noise characteristics in comparison with the Gunn oscillator. The FET oscillator is also characterized by improved efficiency in comparison with the Gunn oscillator as noted in Table 1.

Figure 16:
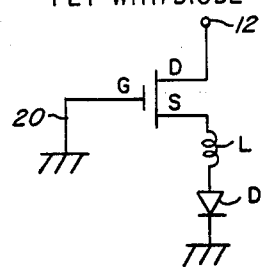
FIG. 16 shows a circuit diagram illustrating an alternate embodiment of the invention including a diode coupled in series with the conductor.
Figure 17:
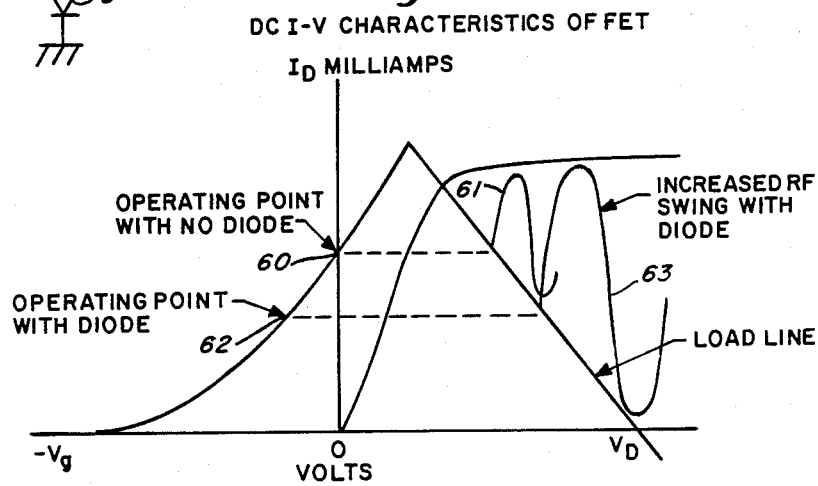
FIG. 17 is a plot of the dc I-V characteristics illustrating the effect of moving the operating point by use of a diode.

A further improvement in efficiency may also be achieved by coupling a diode in series with the source electrode. In this connection, refer to FIG. 16 which shows the circuit diagram illustrating the diode D1 mounted in series with the inductor L. The diode may be in the form of a chip diode mounted in series with the source electrode on the same pedestal. The forward voltage drop of the diode is used to reverse bias the gate electrode and thus has the effect of moving the operating point to a more linear region in the dc I-V characteristics as indicated in FIG. 17. FIG. 17 illustrates the two different operating points that apply. It is noted that at operating point 70 without the use of a diode the voltage swing is limited as indicated by the waveform 71. On the other hand, note also the operating point 72 which is the operating point when a diode is used in series with the inductor. This provides for substantially larger voltage swing as noted by the waveform 73 in FIG. 17. As far as the diode DI is concerned, this may be a GaAs PIN diode. With this arrangement there is a reduction in the current drawn by the transistor from 50 milliamps to 25 milliamps for the same power output.

The embodiment of the invention illustrated in FIGS. 1A–1C includes a FET chip along with passive components such as the inductive wire. This circuit may also be constructed as an integrated monolithic circuit. In this connection, reference may be made to FIG. 18 which shows a two-terminal FET monolithic circuit. The monolithic circuit includes the field effect transistor 10 having gate, drain, and source electrodes. There is also provided a planar diode DI in series with the spiral rectangular inductor L that should provide the desired source inductance. In one arrangement the gate and ground pads can be directly wire-bonded to the pedestal. There are provided gate and ground connecting pads each incorporating a plated through via connecting hole, which when used, removes the step of bonding the gate and source to the pedestal. Only the drain electrode need be bonded to the top of the device in such an arrangement.

Figure 18:
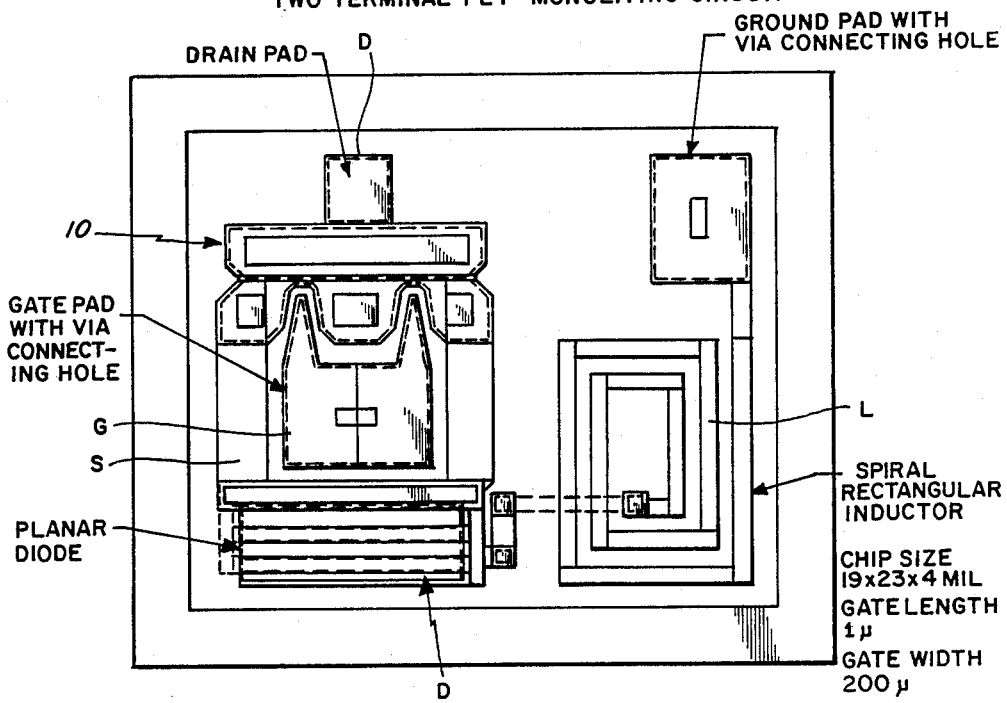
FIG. 18 shows a two terminal FET monolithic circuit.
Figure 19A:
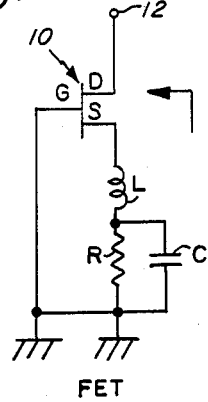
FIG. 19A shows a further alternate embodiment in which the diode is replaced by an RC circuit.
Figure 19B:
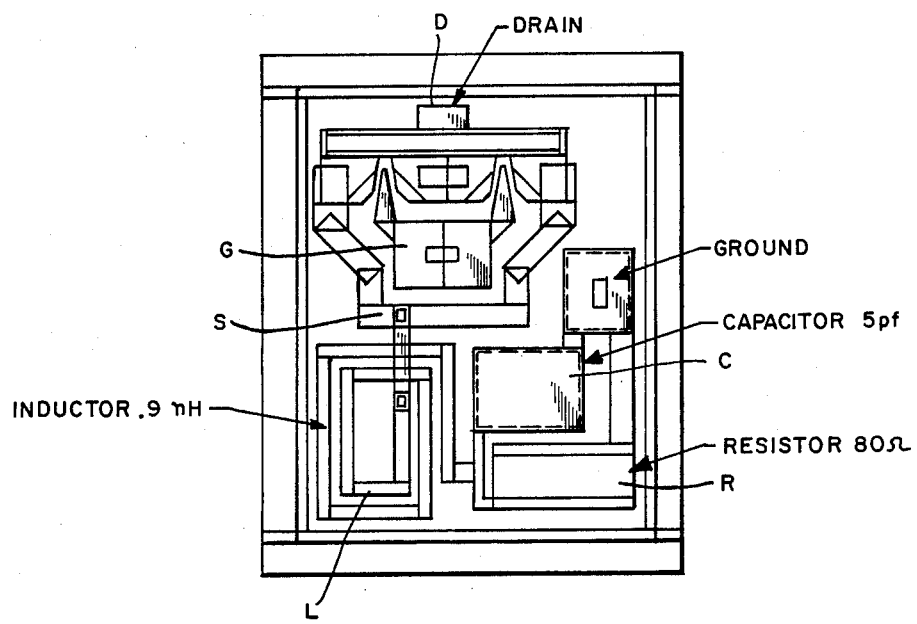
FIG. 19B shows the monolithic circuit embodiment employing the diode.

Reference may also be made to FIGS. 19A and 19B. FIG. 19A shows a further alternate embodiment in which the diode are equivalently replaced by a resistor R and capacitor C connected in parallel. FIG. 19B shows an alternate monolithic circuit that incorporates the capacitor and resistor. The monolithic circuit of FIG. 19A is similar to that shown in FIG. 18 but with the replacement of the diode by the capacitor and resistor. The equivalent circuit of the version of FIG. 19A is substantially the same as that of FIG. 18 and thus the circuit of FIG. 19A also has the effect of moving the operating point in the manner described in connection with FIG. 17.

It should also be noted that the monolithic circuit of FIG. 18 and the monolithic circuit of FIG. 19B may also be constructed without the use of the diode in which case only the rectangular spiral loop inductor is employed as a passive component. The inductor would then be connected directly to the ground pad.

In summary, the two terminal FET oscillator described herein has a number of advantages. This now enables the use of the characteristics of a field effect transistor and yet one that is provided as a two-terminal packaged device. This enables ready replacement of the previously used Gunn diode oscillator circuit by the two-terminal FET. The field effect transistor device is an amplifying rather than a transitime device and thus with the FET oscillator wide-band, mechanical and electrical tuning is possible. The FET device is also characterized by superior frequency stability with temperature and low bias voltage along with higher efficiency. For most commercial applications, the noise levels with the FET device are more than acceptable. Also, the FET device can be provided at relatively low cost. The concepts of the two-terminal FET oscillator, because of its simplicity and compactness, are well suited to applications where cost is an important factor such as in the construction of intrusion alarms and traffic control sensors. The performance outlined above is also excellent for other commercial applications like low cost communication systems and industrial control systems.

ond circuit terminal, and means coupling the source electrode to the second circuit terminal including inductive means of relatively small but sufficient value to enable circuit instability to enable circuit oscillation when mounted in a microwave cavity, said inductive means comprising an inductive element having an inductance in the range of 0.4–1.0 nanoHenry, said means coupling the gate electrode including a length of wire dimensioned to provide an inductance at least an order of magnitude less than the inductance of said inductive element, said gate wire having an inductance on the order of 0.01 nanoHenry, in combination with, package means and circuit support means, said circuit support means comprising a pedestal having said field effect transistor supported thereon and having defined thereon said second circuit terminal, said package means comprising at least an insulating member and conductive member having defined thereat said first circuit terminal.

2. A two-terminal field effect transistor circuit as set forth in claim 1 wherein said inductive means comprises a length of wire.

3. A two-terminal field effect transistor circuit as set forth in claim 2 wherein said gate wire is substantially shorter in length than the source coupling inductance wire.

4. A two-terminal field effect transistor circuit as set forth in claim 3 wherein the length of the inductance wire is in the range of 70–100 mils (1.7–2.5 millimeters) corresponding to X-band operation.

5. A two-terminal field effect transistor circuit as set forth in claim 1 wherein said pedestal is disposed within said package means.

TABLE 1

| TYPICAL COMPARISON OF ELECTRICAL CHARACTERISTICS | | |
|---|---|---|
| | GUNN OSC. | FET OSC |
| Freq. range (mechanically adjustable) | 9245 to 9445 MHz min | same |
| RF Output Power | 20 mW min | 20 mW min |
| Mechanical Tuning Range | 200 MHz | same |
| Electronic Tuning Range | 63 MHz | same |
| RF Power vs temp & tuning voltage | 1.5 dB max | 1.5 dB max |
| RF Power vs Supply voltage variation (Vop + or − 0.5 V) | + or − 1.5 dB | + or − .5 dB max |
| RF Frequency vs Supply voltage variation (Vop + or − 0.5 V) | 2 to 5 MHz/V | less than 0.5 MHz/V |
| Frequency vs temperature | −250 KHz/°C. −150 KHz/°C. | −100 KHz/°C. |
| FM Noise in 1 Hz b.w. at 100 KHz | −115 dBc | −100 dBc |
| DC Bias Voltage | 10.5 + or − 0.5 VDC | 8.0 V + or − 0.5 VDC |
| DC Bias Current | | |
| (operating) | 165 mA max | 45 mA |
| (threshold) | 200 mA max | 50 mA decreases to 25 mA with biasing circuit |
| Tuning Voltage | 0 to 15 VDC | 0 to 15 VDC |
| Turn on voltage | +6.5 V | +4.0 V |

Having described one embodiment of the present invention, it should now be apparent to those skilled in the art that numerous other embodiments are contemplated as falling within the scope of this invention.

What is claimed is:

1. A two-terminal field effect transistor circuit comprising, a field effect transistor having drain, source, and gate electrodes, means defining a first circuit terminal, means conductively coupling the drain electrode to the first circuit terminal, means defining a second circuit terminal, means coupling the gate electrode to the sec- 6. A two-terminal field effect transistor circuit as set forth in claim 1 wherein said means coupling the source electrode to the second circuit terminal further comprises a diode coupled in series with said inductive means.

7. A two-terminal field effect transistor circuit as set forth in claim 6 wherein said diode is directed so that the forward voltage drop thereof reverse biases the gate electrode so as to in effect move the circuit operating point to a more linear region of the current-voltage characteristics of the field effect transistor.

8. A two-terminal field effect transistor circuit as set forth in claim 1 wherein said means coupling the source electrode to the second circuit terminal further comprises a resistor-capacitor network in series with said inductive means.

9. A two-terminal field effect transistor circuit as set forth in claim 8 including means coupling the resistor and capacitor in parallel.

10. A microwave device having only two operative terminals, namely first and second device terminals, formed from a three terminal transistor integrated circuit chip and adapted to replace a microwave diode device, said microwave two terminal device comprising; a transistor packaging means including a circuit chip support means comprising a pedestal means having said circuit chip supported thereon and defining said first device terminal, said transistor packaging means further comprising a conductive member defining said second device terminal and an insulating member intercoupling said pedestal means and conductive member and at least in part defining a cavity for said circuit chip, said integrated circuit chip comprising a field effect transistor having drain, source and gate electrodes, means conductively coupling the drain electrode to said second device terminal, means conductively coupling the gate electrode to said first device terminal with a minimum inductive coupling, and means coupling the source electrode to said first device terminal including inductive means of relatively small but sufficient value to enable circuit instability to enable circuit oscillation when mounted in a microwave cavity, said inductive means comprising an inductive element having an inductance at least an order of magnitude greater than the gate electrode inductive coupling.

11. A microwave device as described in claim 10 wherein said integrated circuit chip further comprises a substrate for supporting said field effect transistor, and said inductive element comprises a formed inductor supported on said substrate.

12. A microwave device as described in claim 11 wherein said means conductively coupling the gate electrode comprises a through connecting hole in the substrate to provide electrical conductivity to said pedestal means.

13. A microwave device as described in claim 12 wherein said means coupling the source electrode comprises a through connecting hole in the substrate to provide electrical conductivity to said pedestal means.

* * * * *